United States Patent
Tonami et al.

[11] Patent Number: 5,818,283
[45] Date of Patent: Oct. 6, 1998

[54] HIGH POWER FET SWITCH

[75] Inventors: Yoshiyuki Tonami; Goro Yoshida; Kazuo Yamashita, all of Mitaka, Japan

[73] Assignee: Japan Radio Co., Ltd., Tokyo, Japan

[21] Appl. No.: 678,668

[22] Filed: Jul. 11, 1996

[30] Foreign Application Priority Data

Jul. 13, 1995 [JP] Japan .................................. 7-177427

[51] Int. Cl.$^6$ .............................................. H03K 17/687
[52] U.S. Cl. ........................ 327/436; 327/427; 327/309
[58] Field of Search .................................. 327/436, 434, 327/427, 308, 309, 315, 318, 321, 327, 328, 430, 431; 333/81 R

[56] References Cited

U.S. PATENT DOCUMENTS

| | | | |
|---|---|---|---|
| 3,731,116 | 5/1973 | Hill | 327/427 |
| 4,647,848 | 3/1987 | Barrett | 327/313 |
| 4,929,855 | 5/1990 | Ezzeddine | 327/427 |
| 5,012,123 | 4/1991 | Ayasli et al. | 327/427 |
| 5,350,957 | 9/1994 | Cooper et al. | 327/427 |
| 5,517,150 | 5/1996 | Okumura | 327/431 |
| 5,563,545 | 10/1996 | Scheinberg | 327/427 |
| 5,717,356 | 2/1998 | Kohama | 327/365 |

*Primary Examiner*—Timothy P. Callahan
*Assistant Examiner*—Terry L. Englund
*Attorney, Agent, or Firm*—Frishauf, Holtz, Goodman, Langer & Chick

[57] ABSTRACT

In an FET switch for controllably allowing and inhibiting passage of an input signal in ON state and OFF state, respectively, FETs are connected in a multi-stage configuration. A control voltage adjusting circuit is connected between a gate and one of a drain and a source of each FET. The control voltage adjusting circuit adjusts a gate-source voltage so as to follow the variation of a drain-source voltage. The input voltage applied to the FET switch in OFF state is divided by the plurality of FETs. Since the variation of the gate-source voltage follows the variation of the drain-source voltage, the FET switch is hardly influenced by an amplitude of the input signal.

5 Claims, 5 Drawing Sheets

HIGH POWER FET SWITCH

BACKGROUND OF THE INVENTION

This invention relates to an FET (Field Effect Transistor) switch and, in particular, to a high power FET switch.

For example, an FET switch is used to share a single antenna by a transmitter and a receiver. Alternatively, the FET switch is used to selectively supply an RF (Radio Frequency) signal received by a single antenna to one of a plurality of receiving circuits.

A conventional FET switch of the type described comprises an FET having a drain, a source, and a gate. The FET has an impedance between the drain and the source. The impedance is controlled by a control signal Vc applied to the gate. For example, a depletion-mode n-channel FET is turned into an ON state when the control voltage Vc applied to the gate is higher than a threshold voltage Vth. On the other hand, the depletion-mode FET is turned into an OFF state when the control voltage Vc applied to the gate is lower than the threshold voltage Vth.

Consideration will now be made as regards the case where an A.C. voltage signal is supplied to the drain of the depletion-mode n-channel FET as a signal to be transmitted or stopped. When the drain-source voltage Vds is negative, the absolute value of a difference between a gate-source voltage Vgs and the drain-source voltage Vds must be greater than the absolute value of the threshold voltage Vth in order to keep the FET in an OFF state. Specifically, an inequality $|Vgs-Vds|>|Vth|$ must hold. When the A.C. voltage signal supplied to the drain has an increased amplitude and another inequality $|Vgs-Vds|<|Vth|$ holds, the FET is turned into an ON state. This means that, under the influence of the signal to be transmitted or stopped, the FET switch can not maintain an ON state or an OFF state as desired.

As described above, the conventional FET switch is disadvantageous in that an ON state or an OFF state can not be maintained under the influence of an electric power (amplitude) of the signal to be transmitted or stopped. In other words, in the conventional FET, a maximum power (maximum amplitude) of the signal controllably transmitted or stopped is restricted by the gate-source voltage Vgs of the FET.

SUMMARY OF THE INVENTION

It is an object of this invention to provide an FET switch which is capable of maintaining a desired on/off state without being affected by an electric power (amplitude) of a signal to be transmitted or stopped.

It is another object of this invention to provide an FET switch which is capable of controllably transmitting/stopping a signal having a great amplitude without restriction by a gate-source voltage.

An FET switch to which this invention is applicable has an input terminal, an output terminal, and a control terminal. The FET switch is for transmitting an input signal from the input terminal to the output terminal in response to a control voltage supplied to the control terminal. According to an aspect of this invention, the FET switch comprises a plurality of FETs each of which has a drain, a source, and a gate connected to the control terminal and which are connected between the input terminal and the output terminal in a multi-stage configuration, and control voltage adjusting means connecting one of the drain with the source and the gate of each FET for adjusting the control voltage in response to the input signal.

DESCRIPTION OF THE PREFERRED EMBODIMENT

Figure 1:
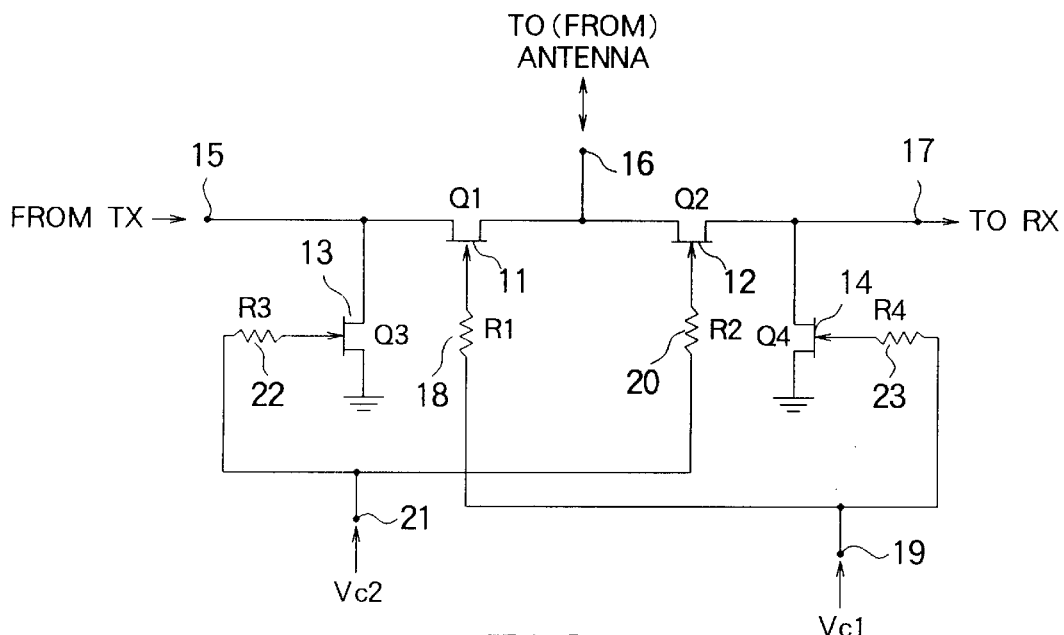
FIG. 1 is a circuit diagram of a conventional FET switch.

Referring to FIG. 1, a conventional FET switch will be described. The FET switch is used in a transceiver in which a single antenna is shared by a transmitter (not shown) and a receiver (not shown). The FET switch comprises first through fourth field effect transistors (FET) 11, 12, 13, and 14 each of which has a drain, a source, and a gate. The first FET 11 is connected between a transmitter port 15 and an antenna port 16. The second FET 12 is connected between the antenna port 16 and a receiver port 17. The third FET 13 is connected between the transmitter port 15 and ground. The fourth FET 14 is connected between the receiver port 17 and ground. The gate of the first FET 11 is connecter through a first resistor 18 to a first control port 19. The gate of the second FET 12 is connected through a second resistor 20 to a second control port 21. The gate of the third FET 13 is connected through a third resistor 22 to the second control port 21. The gate of the fourth FET 14 is connected through a fourth resistor 23 to the first control port 19.

Figure 2:
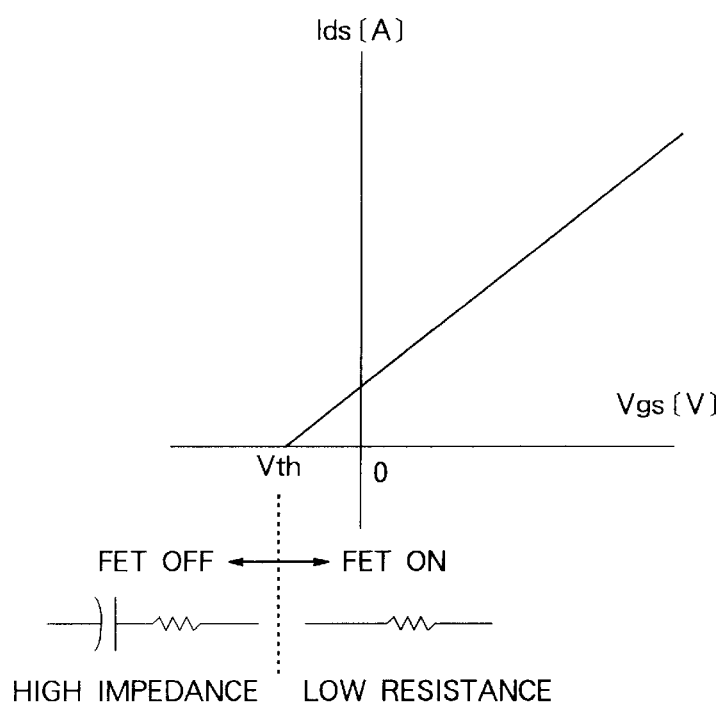
FIG. 2 is a graph showing a gate-source voltage versus drain-source current characteristic of an FET used in the FET switch illustrated in FIG. 1.

Each of the first through the fourth FETs 11, 12, 13, and 14 is, for example, a depletion-mode n-channel FET. In this event, each FET exhibits a Vgs-Ids characteristic illustrated in FIG. 2. In each FET, a drain-source current Ids flows between the drain and the source when a gate-source voltage Vgs is higher than a threshold voltage Vth. On the other hand, when the gate-source voltage Vgs is lower than the threshold voltage Vth, the drain-source current Ids does not flow between the drain and the source. In other words, each FET is turned into ON state to become equivalent to a resistor (low resistance) when the relationship Vgs>Vth holds. On the other hand, each FET is turned into OFF state to become equivalent to a combination of a resistor and a capacitor in series (high impedance) when the relationship Vgs<Vth holds.

Turning back to FIG. 1, it is assumed that the first control port 19 is supplied with a control voltage Vc1 higher than the threshold voltage Vth while the second control port 21 is supplied with a control voltage Vc2 lower than the threshold voltage Vth. In this event, the first and the fourth FETs 11 and 14 are turned into ON state while the second and the third FETs 12 and 13 are turned into OFF state. As a result, the transmitter port 15 and the antenna port 16 are electrically connected while the receiver port 17 is connected to ground.

On the contrary, it is supposed that the first control port 19 is supplied with the control voltage Vc1 lower than the threshold voltage Vth while the second control port 21 is supplied with the control voltage Vc2 higher than the threshold voltage Vth. In this event, the first and the fourth FETs 11 and 14 are turned into OFF state while the second and the third FETs 12 and 13 are turned into ON state. As a result, the antenna port 16 and the receiver port 17 are electrically connected while the transmitter port 15 is connected to ground. Thus, the FET switch illustrated in FIG. 1 is operable as a single-pole double-throw (SPDT) switch.

Figure 3:
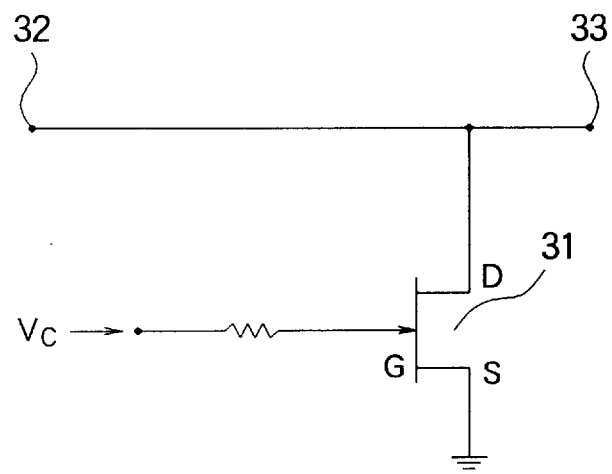
FIG. 3 is a circuit diagram illustrating another conventional FET switch.

Referring to FIG. 3, consideration will be made as regards another conventional FET switch comprising a single FET 31 alone. The FET 31 is a depletion-mode n-channel FET and corresponds to the third or the fourth FET 13 or 14 in FIG. 1. When a gate of the FET 31 is supplied with a control voltage Vc lower than a threshold voltage Vth, the FET 31 is kept in OFF state so that an input signal is transmitted from an input port 32 to an output port 33.

Figure 4:
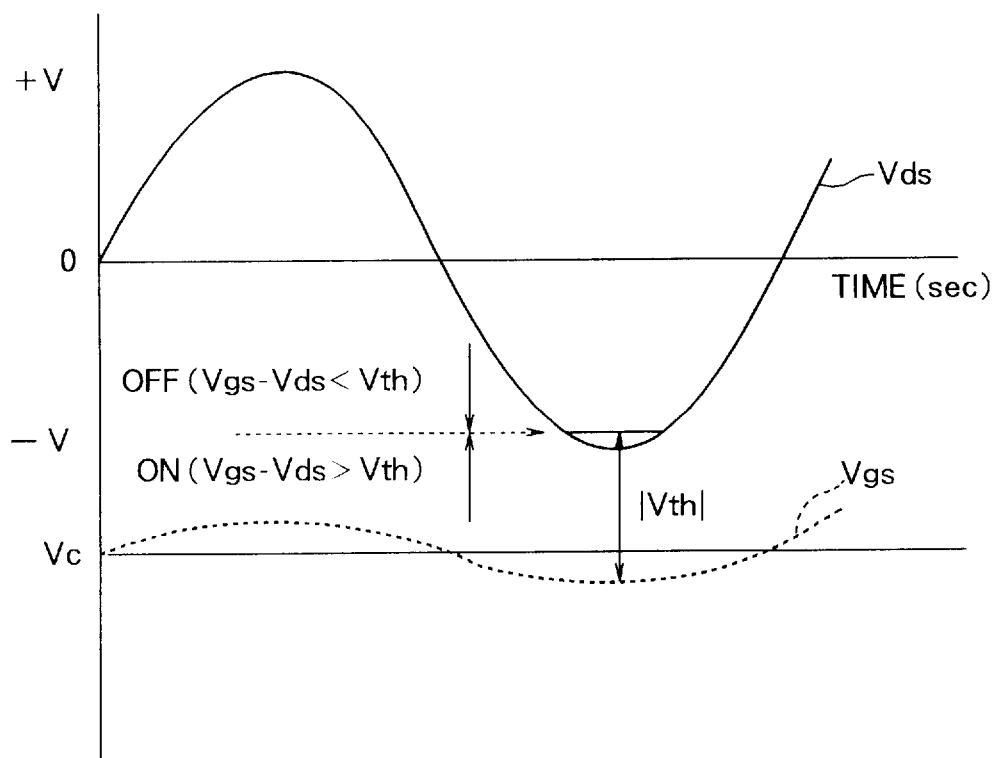
FIG. 4 is a view for describing an operation of the FET switch illustrated in FIG. 3.

It is assumed that the input signal is an A.C. voltage signal. In this event, a drain-source voltage Vds varies as depicted by a solid line in FIG. 4. The FET 31 kept in OFF state is regarded to be equivalent to a capacitor (and a resistor). Accordingly, a gate-source voltage Vgs slightly varies as depicted by a dotted line in FIG. 4. Under the circumstances, the relationship |Vgs−Vds|>|Vth| (alternatively, Vgs−Vds<Vth) must hold in order to keep the FET 31 in OFF state. However, when the input signal has a great amplitude, the relationship |Vgs−Vds|<|Vth| holds. This results in occurrence of a period during which the FET 31 is turned on. In this event, a peak portion of the input signal is clipped to cause distortion of the waveform of the signal transmitted to the output port 33.

Figure 5:
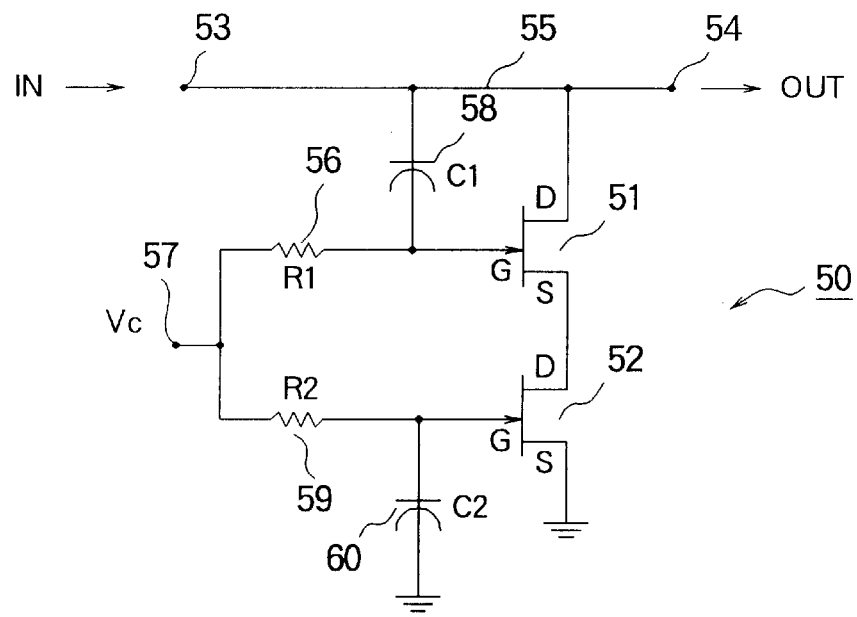
FIG. 5 is a circuit diagram of an FET switch according to an embodiment of this invention.

Referring to FIG. 5, description will now be made as regards an FET switch according to a preferred embodiment of this invention. The FET switch 50 comprises first and second FETs 51 and 52 connected in cascade. The FET switch 50 is connected to a transmission path 55 connected between an input port 53 and an output port 54. The first FET 51 has a gate connected to a control port 57 through a first resistor 56 and to the transmission path 55 through a first capacitor 58. The second FET 52 has a gate connected to the control port 57 through a second resistor 59 and to ground through a second capacitor 60. Each of the first and the second FETs 51 and 52 may be of an enhancement mode or a depletion mode. In the following description, each of the first and the second FETs 51 and 52 is a depletion-mode n-channel FET having a Vgs-Ids characteristic illustrated in FIG. 2.

The FET switch 50 is controlled by a control voltage Vc supplied to the control port 57 to be turned into ON state or OFF state. In other words, each of the first and the second FETs 51 and 52 is controlled by the control voltage Vc supplied to the control port 57 to be turned into an ON state or an OFF state. When the FET switch 50 is in the ON state, the transmission path 55 is connected to ground through the first and the second FETS 51 and 52. At this time, the input signal supplied to the input port 53 is not transmitted to the output port 54. When the FET switch 50 is in the OFF state, the input signal is transmitted from the input port 53 to the output port 54 through the transmission path 55.

Figure 6:
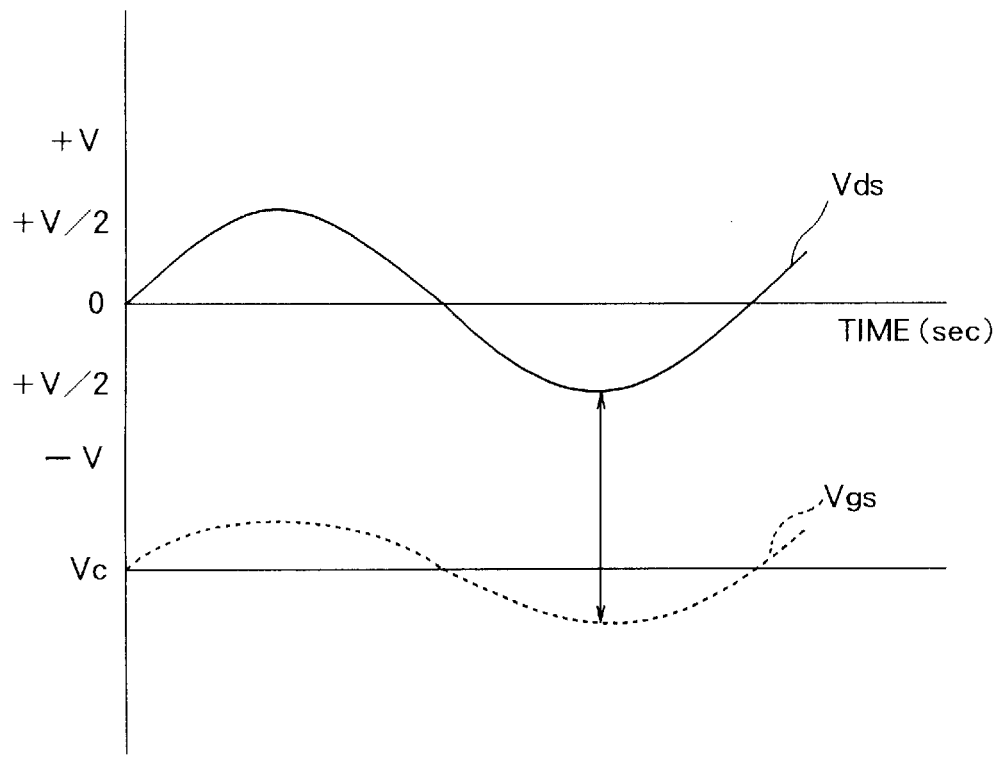
FIG. 6 is a view for describing an operation of an FET used in the FET switch illustrated in FIG. 5.

When the input signal has an amplitude V, a drain-source voltage Vds applied between a drain and a source of each of the first and the second FETs has an amplitude V/2 as depicted by a solid line in FIG. 6. This means that the FET switch 50 can transmit or stop the signal having a maximum amplitude that is theoretically twice as large as compared with the conventional FET switch.

In order to turn the FET switch 50 into an OFF state, the control voltage Vc that is lower than a threshold voltage Vth is applied. In this event, a gate-source voltage Vgs in each of the first and the second FETs 51 and 52 varies in response to voltage variation of the input signal as depicted by a dotted line in FIG. 6. At this time, each of the first and the second capacitors 58 and 60 operates to vary the gate-source voltage Vgs so that the absolute value |Vgs−Vds| is increased in a time domain in which the drain-source voltage Vds is lower than zero. As a result, a maximum amplitude of the drain-source voltage Vds is considerably increased in level within a range satisfying the relationship |Vgs−Vds|>|Vth|.

The gate-source voltage Vgs is expressed as follows:

$$Vgs = \frac{\omega C \cdot 2Z_S}{\sqrt{(1 + \omega^2 C^2 (Z_S + Z_L))}} \times V + Vc,$$

where
  ω=angular frequency (=2πf) of the input signal;
  C=electrostatic capacitance of each of the capacitors 58 and 60;
  $Z_S$=impedance of a switch signal source;
  $Z_L$=load impedance;
  V=amplitude of the input signal;
  Vc=control voltage.

Figure 7:
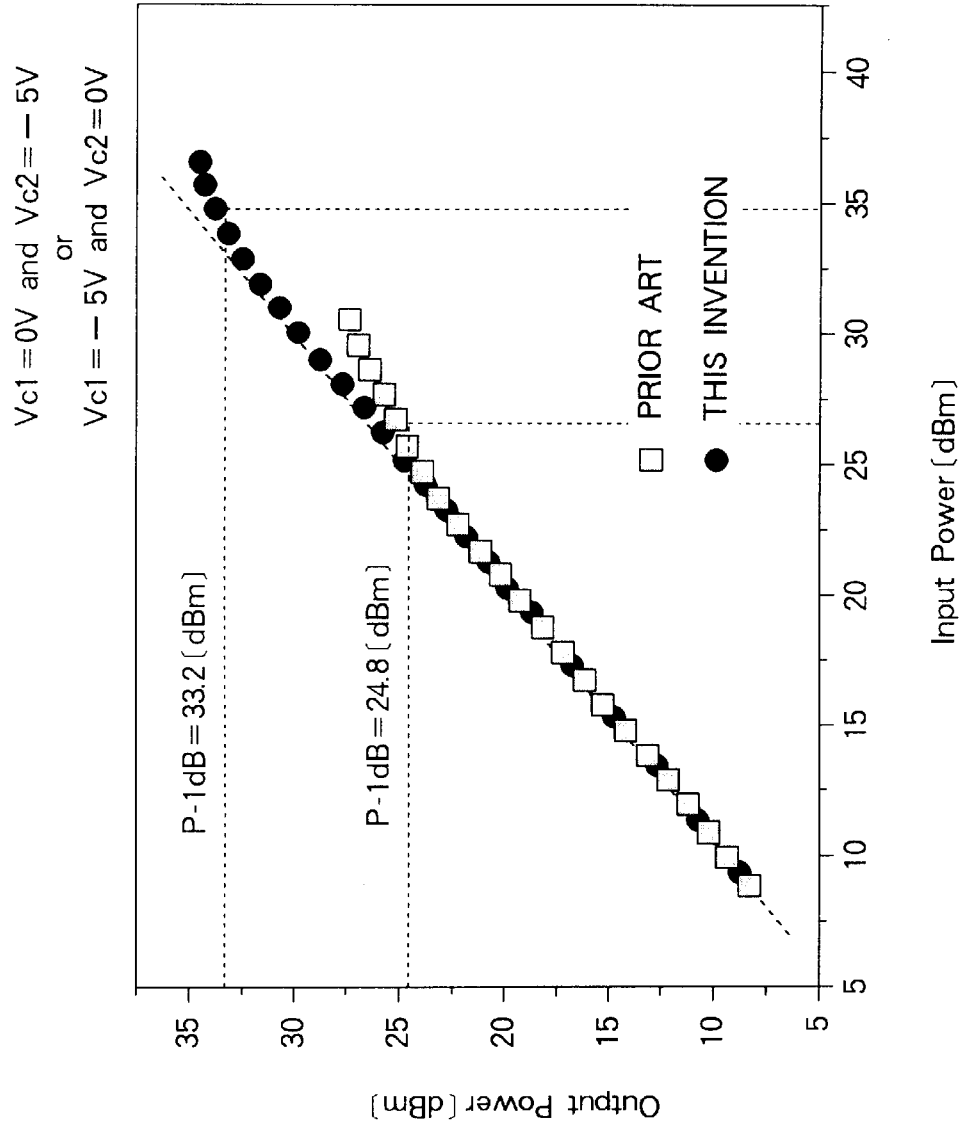
FIG. 7 is a graph illustrating an input versus output characteristic of the FET switch according to this invention.

Referring to FIG. 7, a single-pole double-throw switch (see FIG. 1) using the FET switch 50 in place of each of the first-fourth FETs has an input versus output characteristic depicted by black circles. In FIG. 7, squares represent an input versus output characteristic of the single-pole double-throw switch using the conventional FET switch. As clearly understood from FIG. 7, the single-pole double-throw switch according to the embodiment operates 33.2 dBm at one-decibel compression gain. On the other hand, the conventional single-pole double-throw switch operates 24.8 [dBm] at one-decibel compression gain. Thus, the FET switch according to the embodiment can transmit the input signal of a greater electric power, as compared with that acceptable in the conventional FET switch, without reducing the electric power, namely, without distortion of the waveform.

Figure 8:
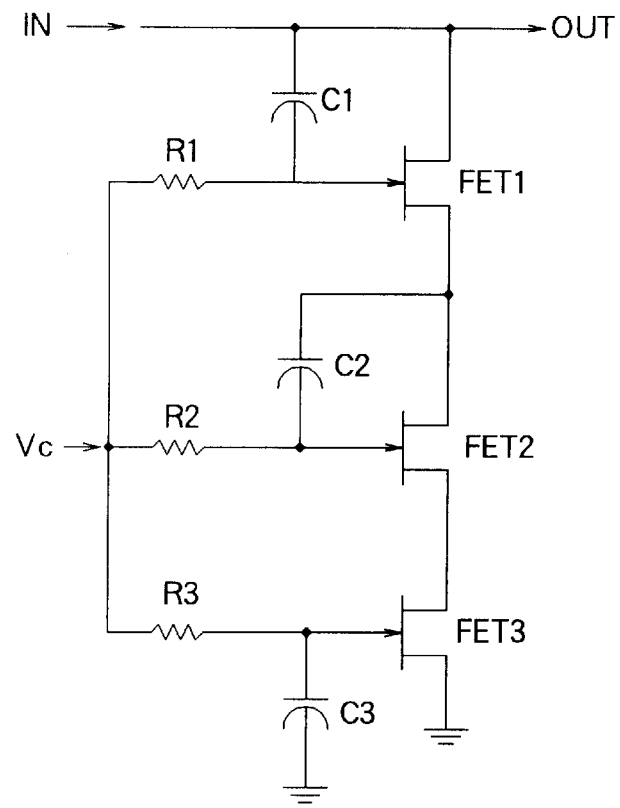
FIG. 8 is a circuit diagram of an FET switch according to another embodiment of this invention.
Figure 9:
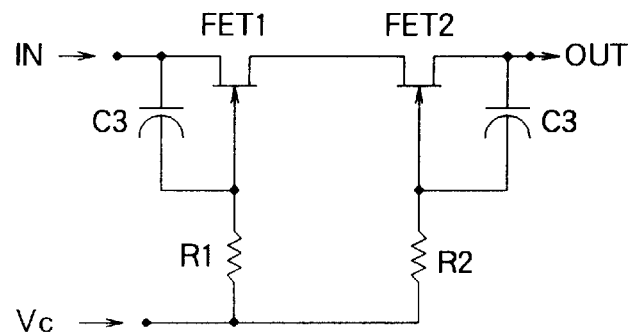
FIG. 9 is a circuit diagram of an FET switch according to still another embodiment of this invention.

It will readily be understood that this invention is not restricted to the preferred embodiments described above but includes various modifications without departing from the scope of this invention. For example, as illustrated in FIG. 8, three or more FETs may be connected in a multi-stage configuration. Just as in FIGS. 5 and 6, where two FETs are used, Vds for each is V/2, analogously when n FETs are used, Vds for each is V/n. Alternatively, as illustrated in FIG. 9, a plurality of FETs may be connected between the input and the output ports in a multi-stage configuration. Furthermore, instead of any of the capacitors used in the embodiments of FIG. 5, 8, or 9, a substitution therefor may be made of a resistor or a combination of a capacitor and a resistor.

What is claimed is:

1. An FET switch having an input terminal, an output terminal, and a control terminal, said FET switch maintaining an ON state for transmitting an input signal from said input terminal to said output terminal and an OFF state for preventing transmission of said input signal from said input terminal to said output terminal, said ON signal and said OFF state being controlled by a control voltage supplied to said control terminal, said FET switch comprising:

a plurality of FETs each of which has a drain, a source, and a gate which is coupled to said control terminal, said FETS being connected between said input terminal and said output terminal in a multi-stage series configuration; and control voltage adjusting means respectively coupling, for each of said FETs, said gate of a respective FET with only one of said drain and said source of said respective FET for adjusting said control voltage in response to said input signal.

2. An FET switch as claimed in claim 1, wherein said control voltage adjusting means comprises a capacitor.

3. An FET switch as claimed in claim 1, wherein said control voltage adjusting means comprises a resistor.

4. An FET switch as claimed in claim 1 wherein the other one of said drain and said source of said respective FET is not coupled to said gate of said respective FET by said control voltage adjusting means.

5. An FET switch as claimed in claim 1 wherein the plurality of FETs is connected to a transmission path between said input terminal and said output terminal.

* * * * *